United States Patent
Naundorf et al.

(10) Patent No.: US 6,696,173 B1
(45) Date of Patent: Feb. 24, 2004

(54) CONDUCTING PATH STRUCTURES SITUATED ON A NON-CONDUCTIVE SUPPORT MATERIAL, ESPECIALLY FINE CONDUCTING PATH STRUCTURES AND METHOD FOR PRODUCING SAME

(75) Inventors: Gerhard Naundorf, Lemgo (DE); Horst Wissbrock, Detmold (DE)

(73) Assignee: LPKF Laser & Electronics AG, Garbsen (DE)

( * ) Notice: Subject to any disclaimer, the term of this patent is extended or adjusted under 35 U.S.C. 154(b) by 0 days.

(21) Appl. No.: 09/254,953

(22) PCT Filed: Jul. 16, 1998

(86) PCT No.: PCT/EP98/04413
§ 371 (c)(1),
(2), (4) Date: Mar. 22, 1999

(87) PCT Pub. No.: WO99/05895
PCT Pub. Date: Feb. 4, 1999

(30) Foreign Application Priority Data

Jul. 22, 1997 (DE) .......................... 197 31 346

(51) Int. Cl.⁷ .................. B32B 15/04; B32B 15/08; B05D 7/14; C23C 22/00; C23C 22/78

(52) U.S. Cl. .................. 428/621; 428/620; 428/317.5; 428/403; 427/551; 427/552; 427/96; 427/117; 427/123; 427/301; 427/419.8

(58) Field of Search .................. 428/621, 630, 428/670, 141, 143, 145, 148, 199, 306.6, 307.3, 317.5, 318.4, 323, 328, 345, 402, 403, 432, 434, 450; 427/466, 551, 552, 96, 117, 118, 123, 301, 419.8; 430/324, 417; 205/184, 183; 106/1.21

(56) References Cited

U.S. PATENT DOCUMENTS

| 3,546,011 | A | * | 12/1970 | Knorre et al. .............. 117/212 |
| 4,133,929 | A | * | 1/1979 | Bowes et al. ............... 428/260 |
| 4,169,082 | A | * | 9/1979 | Kusterer, Jr. ............. 260/23 AR |
| 4,251,596 | A | * | 2/1981 | de Montingny et al. ..... 428/447 |
| 4,504,529 | A | * | 3/1985 | Sorensen et al. ........... 427/437 |
| 4,668,330 | A | * | 5/1987 | Golden ........................ 156/601 |
| 4,692,345 | A | * | 9/1987 | Nishiura et al. .............. 427/39 |
| 4,726,908 | A | * | 2/1988 | Kruse et al. .................. 252/91 |
| 5,032,488 | A | * | 7/1991 | Finter ......................... 430/270 |
| 5,405,656 | A | * | 4/1995 | Ishikawa et al. ............ 427/500 |
| 5,487,964 | A | * | 1/1996 | Reichert et al. .............. 430/16 |
| 5,593,739 | A | * | 1/1997 | Kickelhain .................. 427/555 |
| 6,319,564 | B1 | * | 11/2001 | Naundorf et al. ........... 427/531 |

FOREIGN PATENT DOCUMENTS

| EP | 0 277 325 | * | 8/1988 |
| JP | 61-141774 | * | 11/1986 |
| JP | 5-037129 | * | 2/1993 |

OTHER PUBLICATIONS

G.G. Hawley, Condensed Chemical Dictionary, 9th edition, 1977 (New York), Van Nostrand Reinhold Co., p. 430 (no month).*

J. Ganz et al., "LAD—Ein neuartiges lasergestutztes Beschichtungsverfahren fur Feinstleitermetallisierungen," GALVANOTECHNIK., Bd. 81, Nr. 10, Oktober 1990, Seiten 3661–3668, XP002085825, (Oct. 1990).*

* cited by examiner

Primary Examiner—Michael La Villa
(74) Attorney, Agent, or Firm—Crowell & Moring LLP

(57) ABSTRACT

Described are conductor track structures on a nonconductive support material, especially fine conductor track structures, which are comprised of a base containing a heavy metal and a metallized coating applied to this, and a method for their production. The invention is characterized in that the heavy metal base in the area of the conductor track structures contains heavy metal nuclei, which have been created by the breakup of an organic nonconductive heavy metal complex, and that the support material contains microporous or microrough support particles to which the heavy metal nuclei are bound. An outstanding strength of adhesion of the deposited metal conductor tracks is achieved. The method is especially suitable also for the production of three-dimensional circuit supports.

29 Claims, No Drawings

CONDUCTING PATH STRUCTURES SITUATED ON A NON-CONDUCTIVE SUPPORT MATERIAL, ESPECIALLY FINE CONDUCTING PATH STRUCTURES AND METHOD FOR PRODUCING SAME

BACKGROUND OF THE INVENTION

The invention relates to conductor track structures on a nonconductive support material, especially fine conductor path structures, and a process for production of the conductor track structures.

From the reprint, "LAD-Ein neuartiges lasergestütztes Beschichtungsverfahren für Feinstleitermetallisierungen" [a novel laser-assisted coating process for fine conductor metallization], from issue number 10, volume 81 (1990) of the technical periodical "Galvanotechnik," it has become known to apply palladium acetate from a solution as a thin film to an entire surface in order to produce very fine conductor structures of well under 100 mm. By a subsequent laser treatment with an excimer laser with a wavelength of 248 nm, metal atoms are then said to be released in the area of the conductor track structures being produced, to serve as nuclei for a subsequent nonelectrical metallization. Prior to the metallization, however, it is necessary to perform a rinse to remove the undecomposed areas of the metal-containing film applied to the support material. The quality of this rinse plays a decisive part in the prevention of wild growth problems in the subsequent nonelectrical metallization. It has been found anyway that adequate adhesion of the deposited metal conductor tracks cannot be achieved by the described method.

SUMMARY OF THE INVENTION

It is the object of the invention to provide fine conductor track structures of electrical circuits that are simple and reliable to produce, especially also on three-dimensional circuit substrates, and furthermore to provide a substantially simplified and reliable method for producing conductor track structures, which will permit the production of fine structures by selective surface activation and reductive copper deposition.

This object is achieved by the invention as described hereinafter.

Since the heavy metal base of the support material in the area of the conductor track structures contains heavy metal nuclei which are formed by the breakup of an electrically nonconductive organic heavy metal complex applied to a microporous surface of the support material, a metallization can be performed without the necessity of first removing the untreated areas of the base containing the heavy metal in order to avoid wild growth problems.

Additionally, an outstanding adhesion of the deposited metal conductor tracks is achieved, since the support material contains microporous or microrough support particles to which the heavy metal nuclei are bound. In the metallization, a solid rooting is achieved by the copper growing into the pores and thus optimum adhesion of the applied conductor lines on the circuit support is assured.

DETAILED DESCRIPTION OF PREFERRED EMBODIMENTS

The accessibility of the adhesion-promoting micropores is furthermore enhanced by the fact that the support material is comprised of a polymer matrix with embedded microporous or microrough support particles for the heavy metal nuclei which are exposed by the ablation of the polymer by the UV radiation applied to the surface, but are not themselves decomposed by the UV radiation. Thereafter, the workpiece can be directly metallized by chemical reduction. Thus, according to the invention, activation is performed with a double effect, in that on the one hand the micropores or the microroughness necessary for metal adhesion are exposed, and on the other hand the necessary heavy metal nuclei also are released there by the breakup of the organic, nonconductive heavy metal complex.

Since in the method of the invention an organic nonconductive heavy metal complex is bonded as a heavy metal containing component to microporous support particles, the support particles are mixed into the support material in the area of the conductor track structures that are to be produced, and/or they are applied and bound to the support material, an electromagnetic UV radiation is selectively applied in the area of the conductor track structures being produced, such that support particles are exposed by ablation and heavy metal nuclei are released by a breaking up of the bound heavy metal complex, and this area is then metallized by chemical reduction in order to form the conductor track structures, on the one hand the micropores or microroughness necessary for adhesion of the metal are exposed and on the other hand, even there the necessary heavy metal atoms are released by the breakup of the organic, nonconductive heavy metal complex.

It is an advantage that the chemically reductive metallization can be performed directly after the action of the electromagnetic UV irradiation. No problematic rinsing process is necessary. The UV radiation causes a breakup of the heavy metal complex in the area of the conductor track structures being produced, thereby splitting off heavy metal nuclei which are highly reactive for the partial reductive metallization. The metallization nevertheless takes place without any wild growth and very sharp contours are formed. The high reactivity of the heavy metal nuclei additionally favors the desired precise metallization in the necessary layer thickness.

Within the scope of the invention it is contemplated that electromagnetic radiation from a UV laser, an excimer laser or an UV radiator may be used. According to a preferred embodiment of the invention, a KrF excimer laser with a wavelength of 248 nm is used in order to expose the microporous filler particles and split off the heavy metal nuclei.

Preferably a palladium complex or a heavy metal complex containing palladium is used. As has been found, such heavy metal complexes are especially well suited for the very fine structuring by the method of the invention. In particular, ultraviolet radiation of a substantially lower energy density is sufficient for initiating the structuring cleavage reaction than is required for the ablation or also for triggering the action mechanism described as decomposition in known systems. In addition, substantially greater areas can be exposed per laser pulse in connection with the structuring than in known ablation techniques.

Within the scope of the invention, it is additionally envisioned that preferably a KrF excimer laser with a wavelength of 248 nm can be used for cleaving the heavy metal nuclei from the heavy metal complex. Thus it is possible to perform the cleavage without heating the complex. In this way melting of materials in the area of treatment is avoided. The result is a very great sharpness of the edges of the areas with cleaved heavy metal nuclei and, as a result, an extremely advantageous, very high edge sharpness in the metallized structures, which is of great importance, especially in very fine conductors.

According to a preferred embodiment, palladium diacetate is reacted with an organic complexing agent to form a palladium complex. As has been found, it is advantageous if a known, highly stable, polyfunctional chelating agent having several ligand atoms, such as N, O, S or P, is used as the organic complex forming agent. Within the scope of the invention it is furthermore provided that the polyfunctional chelating agent also can be used together with ionizing groups, such as hydroxyl or carboxyl groups.

In particular, molecular combinations of sterically hindered aromatic compounds and metal-complexing groups can be used as organic complexing agents. Preferably an organic complexing agent of the formula

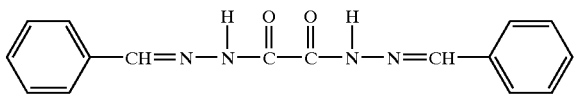

is used.

It is advantageous if support particles resistant to electromagnetic ultraviolet radiation are used as supports for the heavy metal complex. These are preferably inorganic-mineral support particles which are formed from pyrogenic silicic acid or from aerogels.

According to preferred embodiments of the invention the support particles are formed of pyrogenic silicic acid with a BET surface area of 200 $m^2/g$ or of aerogels.

Within the scope of the invention, it is furthermore contemplated that the binding of the heavy metal complex to the support particles is effected by immersing the particles in a solution of the heavy metal complex. The support particles prepared in this way are then mixed into the polymer material from which the circuit supports are injection molded. Alternatively, it is contemplated that the support particles with the heavy metal complex are mixed into a binder, especially a lacquer, and then applied as a coating to the support material.

The method of the invention can be used both with a surface application of laser radiation and masking techniques in an efficient mass production, and without masking, by means of guiding a point-focused laser beam under numerical control, for example, for making prototypes or small series production.

The invention is explained below with reference to a working example.

EXAMPLE 2.24 mass parts of palladium diacetate are dissolved in 100 mass parts of dimethylformamide. Furthermore, 2.94 mass parts of the organic complexing agent of the formula

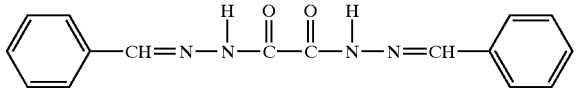

are introduced into 800 mass parts of dimethylformamide and dissolved by heating. Both solutions are then mixed and reacted. Immediately afterward, before the solution cools and the resulting palladium complex precipitates out, support particles, which are composed of a pyrogenic silicic acid which is obtainable under the name "Aerosil 200," are soaked in the solution. After a drying and grinding process, the support particles are mixed in accordance with a conventional preparatory process into a batch of polymer powder in a proportion of up to 50%. After the material has been agglomerated in a hot mixer, it is granulated in a granulator. The synthetic resin granules now contain the necessary amount of the organic heavy metal complex in the pore structure of the incorporated support particles. The granules are then processed by injection molding to form three-dimensional circuit supports.

The circuit supports are then irradiated through a mask with excimer laser ultraviolet radiation having a wavelength of 248 mm. In the irradiated areas the support particles are thus exposed by ablation of the surrounding polymer matrix and at the same time very finely divided metallic palladium is cleaved out of the heavy metal complex in and around the pores of the support particles. In a conventional commercial reductive copper bath without an external power supply, copper deposits itself selectively in the irradiated areas in a very firmly adherent manner. The conductor tracks are formed, and a ready-to-use circuit support is produced.

Alternatively, it is also possible to use Aerogels as support particles. The highly porous solids of $SiO_2$ with a BET surface area of up to 1000 $m^2/g$ permit a still stronger bonding of the metal conductor tracks to the circuit supports.

What is claimed is:

1. A conductor track structure on an area of a nonconductive support material, said conductor track structure comprising a palladium containing base and a metallized layer applied to said base, said palladium containing base comprising palladium containing nuclei formed by breaking up a non-conductive organic palladium containing complex in said area of said nonconductive support material, and said support material containing microporous or microrough support particles to which said palladium containing nuclei are bound, wherein said support particles are selected from the group consisting of pyrogenic silicic acid and aerogels.

2. A conductor track structure according to claim 1, wherein said support material comprises a polymer matrix having said support particles embedded therein.

3. A conductor track structure according to claim 1, wherein said support material comprises a polymer matrix having said support particles bound thereto.

4. A conductor track structure according to claim 1, wherein said support particles are formed of pyrogenic silicic acid having a BET surface area of 200 $m^2/g$.

5. A conductor track structure according to claim 1, wherein said support particles are formed of aerogels.

6. A method of producing a conductor track structure on an area of a nonconductive support material, said conductor track structure comprising a palladium containing base and a metallized layer applied to said base, wherein said area of said nonconductive support material comprises microporous or microrough support particles having a nonconductive palladium containing organic complex bound thereto; and said method comprises the steps of:

selectively applying electromagnetic radiation in the ultraviolet range to said area of said nonconductive support material to expose said support particles by ablation and break down said palladium containing organic complex to release palladium containing nuclei in said area, and thereafter metallizing said area by chemical reduction.

7. A method according to claim 6, wherein said support particles are mixed into and embedded within said support material.

8. A method according to claim 6, wherein said support particles are mixed into a coating material applied to a surface of the support material.

9. A method according to claim 6, wherein an ultraviolet laser, an excimer laser or an ultraviolet radiator is used as a source of said selectively applied electromagnetic radiation.

10. A method according to claim 6, wherein the source of said selectively applied electromagnetic radiation is a KrF excimer laser with a wavelength of 248 nm.

11. A method according to claim 6, wherein said support particles are resistant to ultraviolet radiation.

12. A method according to claim 6, wherein said palladium containing organic complex is bound to said support particles by immersing the particles in a solution of the palladium containing complex and then drying the resulting particles.

13. A method according to claim 6, wherein the support particles with the palladium containing complex bound thereto are mixed into coating material and then applied as coating to the support material.

14. A method according to claim 6, wherein said support particles are inorganic mineral particles.

15. A method according to claim 14, wherein said support particles are formed of pyrogenic silicic acid or of aerogels.

16. A method according to claim 14, wherein said support particles are formed of pyrogenic silicic acid with a BET surface area of 200 $m^2/g$.

17. A method according to claim 6, wherein said palladium containing organic complex is a palladium complex formed by reacting a palladium salt with an organic complexing agent, and precipitating the resulting palladium complex.

18. A method according to claim 17, wherein said palladium salt is palladium diacetate, and said organic complexing agent is a stable, polyfunctional chelating agent.

19. A method according to claim 18, wherein said chelating agent comprises a plurality of ligand atoms selected from the group consisting of nitrogen, oxygen, sulfur and phosphorus.

20. A method according to claim 18, wherein said chelating agent comprises ionizing groups selected from the group consisting of hydroxyl and carboxyl groups.

21. A method according to claim 17, wherein said organic complexing agent is a molecular combination of sterically hindered aromatic groups and metal-complexing groups.

22. A method according to claim 21, wherein said organic completing agent is a compound corresponding to the formula:

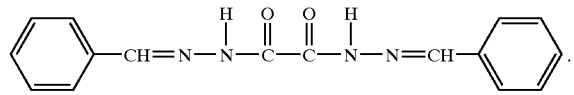

23. A method of producing a conductor track structure on an area of a nonconductive support material, said conductor track structure comprising a palladium containing base and a metallized layer applied to said base, wherein said area of said nonconductive support material comprises microporous or microrough support particles having a nonconductive paladium containing organic complex bound thereto;
and said method comprises:
 selectively applying electromagnetic radiation from an ultraviolet laser, an excimer laser or an ultraviolet radiator to said area of said nonconductive support material to expose said support particles by ablation and break down said palladium containing organic complex to release palladium containing nuclei in said area, and
 thereafter metallizing said area by chemical reduction.

24. A method according to claim 23, wherein said support particles are mixed into and embedded within said support material.

25. A method according to claim 23, wherein said support particles are mixed into a coating material applied to a surface of the support material.

26. A method according to claim 23, wherein said support particles are resistant to ultraviolet radiation.

27. A method according to claim 23, wherein said support particles are inorganic mineral particles.

28. A method according to claim 23, wherein said palladium containing organic complex is bound to said support particles by immersing the particles in a solution of the palladium containing complex and then drying the resulting particles.

29. A method according to claim 23, the support particles with the palladium containing complex bound thereto are mixed into coating material and then applied as coating to the support material.

* * * * *